United States Patent [19]

van der Mark

[11] 4,063,109
[45] Dec. 13, 1977

[54] CLOCK PULSE SYSTEM

[75] Inventor: Jacobus van der Mark, Beekbergen, Netherlands

[73] Assignee: U.S. Philips Corporation, New York, N.Y.

[21] Appl. No.: 746,956

[22] Filed: Dec. 2, 1976

Related U.S. Application Data

[63] Continuation of Ser. No. 585,958, June 11, 1975, abandoned.

[30] Foreign Application Priority Data

June 24, 1974 Netherlands .......................... 7408437

[51] Int. Cl.² .............................................. H03K 3/00
[52] U.S. Cl. ...................................... 307/106; 328/66
[58] Field of Search ................... 307/106, 99, 88 MP, 307/208; 333/20; 336/229; 328/66, 67, 55, 56, 63

[56] References Cited

U.S. PATENT DOCUMENTS

| 2,596,142 | 5/1952 | Gerwin | 328/66 |
|---|---|---|---|
| 3,416,103 | 12/1968 | Goldsworthy | 307/106 |
| 3,731,237 | 5/1973 | Beurrier | 333/32 |

Primary Examiner—David Smith, Jr.
Attorney, Agent, or Firm—Frank R. Trifari; Daniel R. McGlynn

[57] ABSTRACT

A clock pulse system for generating and distributing two clock pulse signals which are symmetrical with respect to each other and which are shifted in time. Each of the clock pulse signals are also symmetrical per se. The system comprises a current source which is arranged to be floating with respect to a fixed potential and which can be switched on and off by a pulse source. The system furthermore comprises a delay line whose ends are connected to the current source, and a load, the delay line and the load being actuatable by the current source. The load is symmetrical, and the distribution of the generated clock pulse signals is effected by way of distribution lines which preferably consist of twisted core pairs.

5 Claims, 6 Drawing Figures

CLOCK PULSE SYSTEM

This is a continuation of application Ser. No. 585,958, filed June 11, 1975, now abandoned.

The invention relates to a clock pulse system for generating and distributing two clock pulse signals which are symmetrical and shifted in time with respect to each other and each of which is also symmetrical per se, comprising a current source which can be switched on and off by a pulse source, a delay line, and a symmetrical load, the delay line and the load being actuatable by the current source. Clock pulses systems of this kind are known and can serve, for example for generating and distributing clock pulse signals in data distribution and data processing systems.

In a clock pulse distribution system, there are two important aspects as regards the proper functioning and the simplicity of the system. Firstly, it is important, that, when use is made of reactive elements in the distribution section of the system, no disturbing direct current components are present in the clock pulse signal. It is advantageous to use reactive elements (transformers or capacitors) for the distribution section, because thus an extensive distribution line network can be realized in a simple manner by using transmission lines. In order to avoid the said direct current components, each of the two clock pulse signals must be accurately symmetrical per se, viewed in time. Secondly, it is important that the two clock pulse signals are also symmetrical with respect to each other. It is thus possible to use inexpensive transmission lines in the distribution section without disturbing reflections and asymmetry occurring in this section. Thus far, the requirements as regards the said symmetries in the clock pulse signals of such a clock pulse system could not be completely satisfied without special steps being taken. In practice, it was found to be impossible, because of the additional steps required, to make full use of the advantages of the symmetries in a simple manner.

The invention has for its object to provide a clock pulse system of the kind set forth whereby the said requirements as regards symmetry are simply satisfied and whereby full use can be made of the advantages inherent of the symmetry achieved. To this end, the clock pulse system according to the invention is characterized in that the current source is arranged to be floating with respect to a fixed potential, the ends of the delay line being connected to the input and the output of the current source, the distribution of generated symmetrical and time-shifted clock pulse signals being effected by way of distribution lines.

Because of the said floating arrangement of the current source, in combination with the delay line and a symmetrical load, two clock pulse signals which are accurately symmetrical with respect to each other and also symmetrical per se and which are shifted in time can be generated. A sudden increase of the current in the current source by a given value will result in a negative voltage on the one side and a positive voltage on the other side of the delay line. After the delay time of the delay line, the positive voltage transient appears, via the delay line, on the said one side of the current source and is superimposed on the previous negative voltage at this area. Similarly, the negative voltage transient is superimposed on the previous positive voltage on the said other side of the current source.

In a preferred embodiment of the clock pulse system according to the invention, the current source consists of a transistor, a first and a second electrode of which are connected to the ends of the delay line and to the relevant distribution lines, the pulse source being reactively coupled between the second and a third electrode of the said transistor. It is thus achieved that the use of only one active element in the system suffices when the pulse source itself is not considered. The latter is jestified by the face that the pulse source is high-frequency isolated from the system. Due to the presence of only one active element, which in this case also performs the typical switch-on/switch-off function, it is ensured that short rise times and higher pulse accuracy are achieved.

All requirements of symmetry are satisfied by the above arrangement. When reactive elements are used in the distribution section, the clock pulse signals can be readily varied. Viewed in time, no disturbing direct current component appears, so that when the clock pulse signal frequency and/or the length of the signals is varied, no distortions will occur. A temporary interruption in the generation of the clock pulse signals may even take place without giving rise to problems. Viewed in time, full compensation is each time ensured. This possibility of faultless temporary interruption can be used to good advantage in test procedures.

The fact that the two clock pulse signals are also fully symmetrical with respect to each other offers the striking advantage of a simple construction of the remainder of the distribution section of the clock pulse system according to the invention. In this respect, a further preferred embodiment of the clock pulse system according to the invention is characterized in that the distribution lines consist of twisted core pairs. The costs of the distribution section can thus be kept low, because a twisted-pair wiring is substantially cheaper than the same wiring using coaxial leads. Moreover, a source of interference is thus eliminated: in spite of the good screening, a coaxial lead readily radiates due to the asymmetry of the cable itself. If leads are not exactly of the same length, an asymmetry is introduced. This is notably applicable also to the transformers in such a system comprising coaxial leads, because undesired pulse shifts occur due to the occurrence of reflections in the case of lengths which are not exactly the same. In this set-up, per distribution line two signals occur: i.e. two time-shifted symmetrical clock pulses. Via the twisted core pair, in total four signals are transported. However, four cables (double pair) are not required.

In order to enable an extensive distribution of two time-shifted clock pulse signals via the said distribution lines (transmission lines constructed as twisted core pairs) to a large number of users, while always maintaining the advantages of the symmetry, a further preferred embodiment yet according to the invention is characterized in that for the distribution of the generated clock pulse signals use is made of transformers which comprise turns wound by transmission lines, the ends of the transmission lines being parallel connected on one side and series connected on the other side. In view of the foregoing and in order to compensate for the internal transformer effects completely at all times, the transformers used in the clock pulse signal according to the invention are preferably bifilarly wound using twisted wire.

The invention will be described in detail hereinafter with reference to the drawing. The figures show embodiments according to the invention; however, the invention is not restricted thereto.

Figure 1:
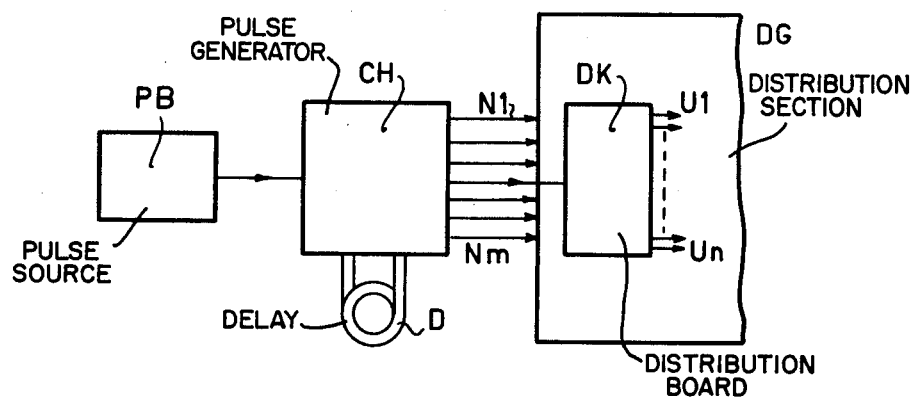
FIG. 1 shows a block diagram of the clock pulse system according to the invention.

The block diagram shown in FIG. 1 illustrates how the clock pulse system according to the invention is constructed. The system consists of a pulse source PB, a clock pulse generating section CH, comprising a delay cable D, and distribution section DG. Each output $Ni$ . . . $Nm$ of the section CH is connected to a distribution board DK of the distribution section DG. A distribution board DK comprises outputs $Ui$ . . . $Un$ whereto the users of the clock pulse signals are connected. The number of users which can be serviced by this clock pulse system is thus equal to the product $m \cdot n$. The setting of the clock pulse signals is effected by the adjustment of the pulse source PB and by the choice of the length of the delay cable D. Single-shot signals can also be generated by the clock pulse generating section.

Figure 2:
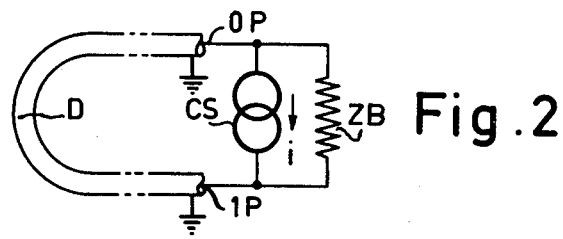
FIG. 2 is a diagrammatic view of the clock pulse generating section of the clock pulse system.
Figure 3:
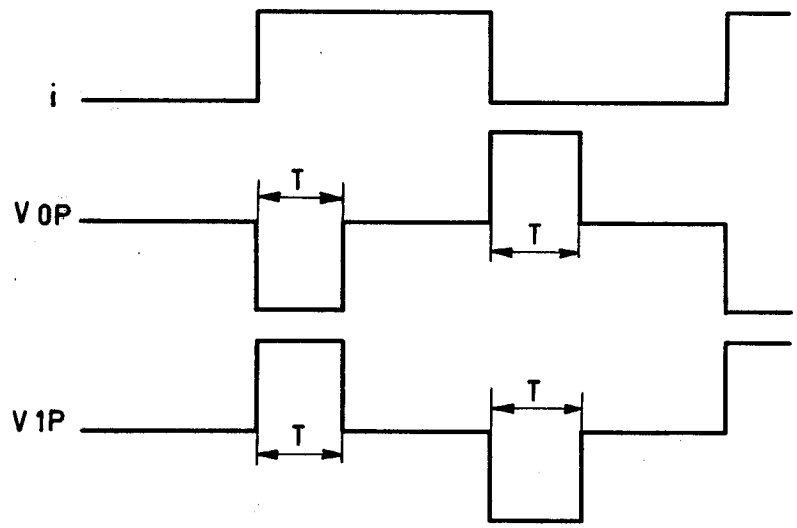
FIG. 3 shows a number of signal diagrams associated with the clock pulse generating section shown in FIG. 2.

FIG. 2 is a more detailed diagrammatic representation of the clock pulse generating section. The current source, driven by the pulse source PB as shown in FIG. 1, is denoted by the reference CS. This current source CS is arranged to be floating between the ends 0P and 1P of the delay line D. On the other side, the current source CS is also connected to a symmetrical load ZB. In this arrangemnet, the current source CS actuates the line D and the load ZD. If the current $i$ (see FIG. 3) increases by a given value at a given stant, a negative voltage transient occurs on VOP and a positive voltage transient occurs on VIP (see FIG. 3). After the delay time T of the delay line D, the positive voltage transient appears, via the delay line, on the side 0P of the current GS and is superimposed on the voltage VOP. Similarly, the negative voltage transient is superimposed on VIP. Due to the symmetrical loading of the current source, VOP and VIP (clock pulse signals, FIG. 3) are also symmetrical. The load ZB is chosen such that the delay line D is characteristically terminated, so that no further reflections occur. To this end, ZB $\times$ 2 $\times$ the characteristic table impedance. If the current $i$ decreases at a given instant, a positive pulse appears on OP and a negative pulse appears on 1P of FIG. 2 in a corresponding manner.

Figure 4:
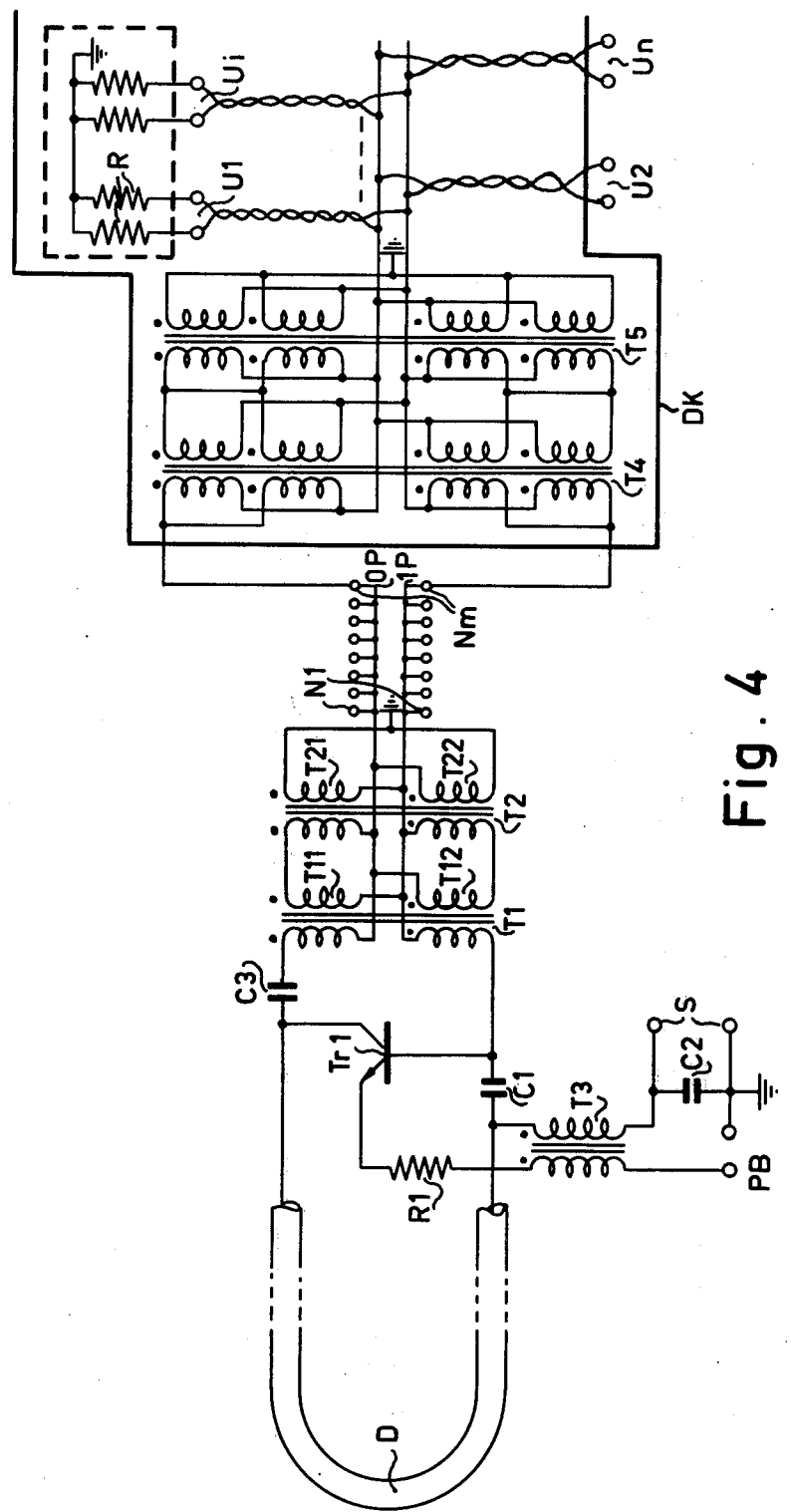
FIG. 4 is a detailed view of a clock pulse system according to the invention.

FIG. 4 shows a detailed embodiment of a clock pulse system according to the invention. The current source is constructed as a transistor Tr1 in a grounded-base connection. This transistor is driven by the pulse source PB. The reference S denotes the general supply source of the system. The uncoupling transformer T3 ensures that the current source floats with respect to earth, in spite of the fact that the pulse source itself is connected to earth. The resistor R1 provides proper termination of the pulse source. Capacitors C1, C2 and C3 provide the high-frequency short circuit in the circuit. Because of the use of the transistor Tr1 as the sole active element in the circuit, it is achieved that severe tolerance requirements as regards the shape of the clock pulse signals can be satisfied. In the clock pulse generating section the load is formed by in this case 4 : 1 transformation by way of transformers T1 and T2. Each of these transformers consists of 2 uncoupling sub-transformers T11, T12 and T21 and T22 which are connected in series on one side and in parallel on the other side. These transformer are preferably bifilarly wound with twisted-wire transmission lines, the ends of the transmission lines being connected in parallel on one side and in series on the other side. By choosing the characteristic impedance of the twisted wire to be 4 $\times$ the secondary load in this example, a fully adapted transport via the transformers will be effected. On the primary, 4 $\times$ 4 times the secondary load is present, and on the secondary $\frac{1}{4} \times$ 4 times the secondary load is present. If the delay line D is a cable having a resistance of 75 ohms, so that the load must be 150 ohms, the characteristic impedance of the transformer windings must be 150/4 = 37.5 ohms. Because the transformers are symmetrically driven, and because the output signal must also be symmetrical, the outer windings may be wound on one core. The same is applicable to the inner windings.

Considering the foregoing, the secondary load of the transformers must in principle be ($\frac{1}{4} \times$ 4) times the secondary load, 1/16 $\times$ 150 ohms. This can be realized for example, by using 8 cables of 75 ohms in parallel. If losses occur, notably in the transformers, they must be compensated for by adaptation of the load. In this manner, there are N1, N2, . . . N8 ($m=8$) outputs 0P, 1P to the clock pulse generating section of the clock pulse system. If less than m = 8 outputs are required for the further distribution of the clock pulse signals during use of this clock pulse system, the load of the clock pulse generating section should be supplemented by dummy resistors to ensure correct loading, until in this example a total of 8 $\times$ 75 ohms in parallel is reduced.

Assume that a distribution board DK is connected to the output $Nm$. This distribution board is shown in detail in FIG. 4. In this example, it is assumed that clock pulse signals are present which satisfy the imposed requirements for the users as far as time characteristic is concerned. The amplitude, however, is larger by a factor 16 than is required for the users (for example, logic boards). In the clock pulse generating section, the amplitude is already stepped down by a factor 4. Consequently, further stepping down by a factor 4 must be effected on the distribution board. Because of this indentical factor, the transformers on the distribution board could be the same as those in the clock pulse generating section. However, because the input impedance is lower (75 ohms instead of 150 ohms), the winding impedances of the transformers used must now be 37.5 $\times \frac{1}{4}$. In order to achieve this, the transformers T4 and T5 of a distribution board always have two parallel-connected windings. Using this arrangment, the secondary load is also different, i.e. 1/16 $\times$ 75 ohms. This corresponds, for example, to 32 cables of 150 ohms in parallel. Due to the low impedance of the transformers of the distribution board, the losses incurred therein are less than those of the transformers of the clock pulse generating section. If losses occur, they can again be compensated for by adaptation of the load. FIG. 4 show 32 outputs $Ul$, $Us$, . . . $Un$ ($n = 32$). If $n(= 32)$ users are not actuated during use, the load should be supplemented to ($n$) 32 $\times$ 150 ohms in parallel by means of dummy resistors FIG. 4 illustrates how this can be effected on a distribution board by means of two resistors R of 75 ohms connected to earth per output not used ($Ul$, $Ui$). It is to be noted that the said clock pulse signals VOP and VIP are transported to the users via the core pairs in the clock pulse system in the form shown in FIG. 3. This is necessary in order to maintain the symmetries at all times. However, it will be obvious that a user itself will be capable of taking up the pulse signals required by this user. For example, generally per user a given detection level can be adjusted, so that, for example, the negative pulses of the clock pulse signals are not admitted to the user. Such a detection level can be simply determined already by the sensitivity of the user.

Figure 5:
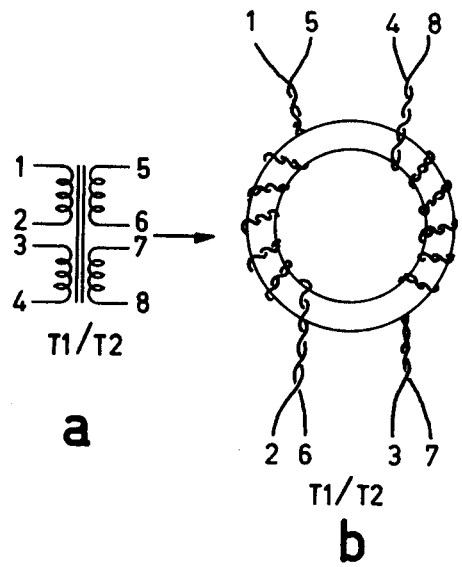
FIGS. 5 and 6 shows a feasible construction of the transformers used in the clock pulse system according to the invention.

FIG. 5 shows a feasible embodiment of a transformer T1 or T2 of the clock pulse generating section. In this case this transformer is a bifilarly twisted wire transformer which is wound on a ring core.

Figure 6:
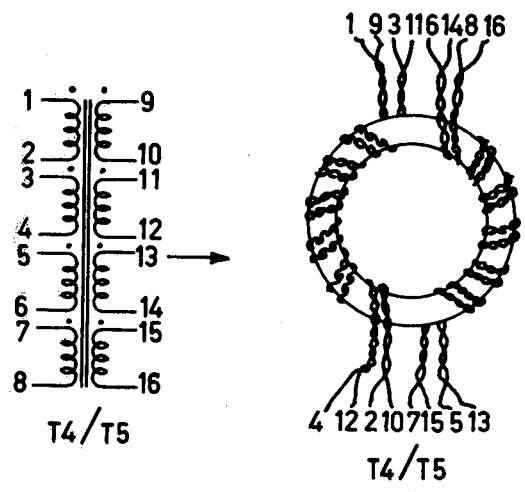

Similarly, FIG. 6 shows a feasible embodiment of a transformer T4 or T5 of a distribution board. In these figures the references refer to corresponding wire ends.

What is claimed is:

1. A clock pulse system for generating and distributing two clocks pulse signals which are symmetrical and shifted in time with respect to each other, comprising
 a pulse source;
 a current source which can be switched on and off by said pulse source, comprising control means having electrodes, said pulse source being reactively coupled between said electrodes of said control means; and
 a delay line arranged to be floating with respect to a fixed potential, connected to said current source; the ends of said delay line being connected to said electrodes.

2. The clock pulse system as defined in claim 1, wherein said control means comprises a transistor having first, second, and third electrodes.

3. The clock pulse system as defined in claim 2, wherein said pulse source is reactively coupled between said second and third electrodes of said transistor.

4. The clock pulse system as defined in claim 1, further comprising a symmetrical load, connected to said delay line and actuatable by the current source, comprising distribution lines for the distribution of generated symmetrical and time-shifted clock pulse signals.

5. The clock pulse system as defined in claim 4, wherein said load includes transformers bifilarly wound on cores with twisted wire, each of said transformers comprising turns of wire wound with said distribution lines, the ends of said distribution lines being connected in parallel on one side and in series on the other side.

* * * * *

UNITED STATES PATENT AND TRADEMARK OFFICE
CERTIFICATE OF CORRECTION

PATENT NO. : 4,063,109

DATED : December 13, 1977

INVENTOR(S) : JACOBUS VAN DER MARK

It is certified that error appears in the above-identified patent and that said Letters Patent are hereby corrected as shown below:

Column 3, line 42, "GS" should be --CS--

Signed and Sealed this

Fourth Day of April 1978

[SEAL]

Attest:

RUTH C. MASON
Attesting Officer

LUTRELLE F. PARKER
Acting Commissioner of Patents and Trademarks